(12) United States Patent
Sudo et al.

(10) Patent No.: US 12,371,813 B2
(45) Date of Patent: Jul. 29, 2025

(54) SILICON WAFER AND METHOD FOR PRODUCING SILICON WAFER

(71) Applicants: GLOBALWAFERS JAPAN CO., LTD., Niigata (JP); TOHOKU UNIVERSITY, Miyagi (JP)

(72) Inventors: Haruo Sudo, Niigata (JP); Takashi Ishikawa, Niigata (JP); Koji Izunome, Niigata (JP); Hisashi Matsumura, Niigata (JP); Tatsuhiko Aoki, Niigata (JP); Shoji Ikeda, Miyagi (JP); Tetsuo Endoh, Miyagi (JP); Etsuo Fukuda, Miyagi (JP)

(73) Assignees: GLOBALWAFERS JAPAN CO., LTD., Niigata (JP); TOHOKU UNIVERSITY, Miyagi (JP)

( * ) Notice: Subject to any disclaimer, the term of this patent is extended or adjusted under 35 U.S.C. 154(b) by 192 days.

(21) Appl. No.: 18/011,422

(22) PCT Filed: Jun. 14, 2021

(86) PCT No.: PCT/JP2021/022485
§ 371 (c)(1),
(2) Date: Dec. 19, 2022

(87) PCT Pub. No.: WO2021/261309
PCT Pub. Date: Dec. 30, 2021

(65) Prior Publication Data
US 2023/0243062 A1    Aug. 3, 2023

(30) Foreign Application Priority Data
Jun. 24, 2020   (JP) ................. 2020-108627

(51) Int. Cl.
*C30B 29/06* (2006.01)
*C30B 15/20* (2006.01)
(Continued)

(52) U.S. Cl.
CPC ............ *C30B 15/203* (2013.01); *C30B 29/06* (2013.01); *C30B 33/02* (2013.01); *H01L 21/3225* (2013.01)

(58) Field of Classification Search
CPC ....... C30B 15/00; C30B 15/203; C30B 29/06; C30B 33/02; H01L 21/322; H01L 21/3221; H01L 21/3225; H01L 21/324
See application file for complete search history.

(56) References Cited

U.S. PATENT DOCUMENTS

2005/0250349 A1    11/2005  Sadamitsu et al.
2009/0297426 A1*   12/2009  Katoh ................. C30B 15/04
                                                   423/325
(Continued)

FOREIGN PATENT DOCUMENTS

JP     2008-207991     9/2006
JP     2010-40587      2/2010
(Continued)

OTHER PUBLICATIONS

International Preliminary Report on Patentability dated Dec. 13, 2022 in International (PCT) Application No. PCT/JP2021/022485.
(Continued)

*Primary Examiner* — Matthew J Song
(74) *Attorney, Agent, or Firm* — Wenderoth, Lind & Ponack, L.L.P.

(57) ABSTRACT

A silicon wafer is a Czochralski wafer formed of silicon. The wafer includes a bulk layer having an oxygen concentration of $0.5 \times 10^{18}/cm^3$ or more; and a surface layer extending from the surface of the wafer to 300 nm in depth, and having an oxygen concentration of $2 \times 10^{18}/cm^3$ or more.

4 Claims, 4 Drawing Sheets

(51) Int. Cl.
*C30B 33/02* (2006.01)
*H01L 21/322* (2006.01)

(56) References Cited

U.S. PATENT DOCUMENTS

| | | |
|---|---|---|
| 2010/0038757 A1 | 2/2010 | Isogai et al. |
| 2010/0105191 A1 | 4/2010 | Hayamizu et al. |
| 2011/0143526 A1 | 6/2011 | Sadohara |
| 2015/0001680 A1 | 1/2015 | Oka et al. |
| 2015/0044422 A1* | 2/2015 | Araki ............... C30B 29/06 |
| | | 438/795 |
| 2020/0149184 A1 | 5/2020 | Mangelberger et al. |
| 2020/0181802 A1 | 6/2020 | Maeda et al. |
| 2020/0211840 A1 | 7/2020 | Kamijo et al. |
| 2020/0240039 A1 | 7/2020 | Mueller et al. |

FOREIGN PATENT DOCUMENTS

| | | |
|---|---|---|
| JP | 2013-143504 | 7/2013 |
| JP | 2015-32810 | 2/2015 |
| JP | 2020-502028 | 1/2020 |
| KR | 10-2005-0035862 | 4/2005 |
| KR | 10-2018-0094102 | 8/2018 |
| TW | 200845223 | 11/2008 |
| TW | 201513224 | 4/2015 |
| WO | 2010/016586 | 2/2010 |
| WO | 2017/208582 | 12/2017 |
| WO | 2019/017326 | 1/2019 |

OTHER PUBLICATIONS

International Search Report issued Aug. 17, 2021 in International (PCT) Application No. PCT/JP2021/022485.

* cited by examiner

SILICON WAFER AND METHOD FOR PRODUCING SILICON WAFER

TECHNICAL FIELD

The present invention relates to a silicon wafer having a surface layer in which semiconductor devices are formed, and a method for producing the silicon wafer.

BACKGROUND ART

For the purpose of, e.g., reducing the leakage current of semiconductor devices such as transistors, semiconductor devices having, instead of a conventional planar structure, a three-dimensional structure of pillars, fins, etc. have been developed in recent years. An epitaxial wafer is generally used for such semiconductor devices which is obtained by slicing a silicon ingot grown by the Czochralski method, and which has a surface formed with an epitaxial layer of silicon.

However, as such a device structure is refined to the nano level, in the step of thermally oxidizing pillars, fins, etc. made of silicon to form gate oxide films on the surfaces, a silicon missing phenomenon is occurring frequently, in which silicon atoms are released from the pillars, the fins, etc. This silicon missing phenomenon causes the cores of the pillars, the fins, etc. to become thin and collapse, or causes the interfaces between the cores and the gate oxide films to become uneven, thereby increasing electrical resistance.

The inventors of the present application reached, from experimental results which they have obtained so far, the conclusion that, as disclosed, for example, in PCT International Publication No. WO2019/017326 (hereinafter, WO '326), the higher the oxygen concentration near the surface of the wafer, the higher the effect of reducing the silicon missing phenomenon, and they tried to increase the oxygen concentration in the surface by using a polished wafer instead of an epitaxial wafer, which is low in oxygen concentration in its surface layer. As a means for increasing the oxygen concentration in the surface of the wafer, as disclosed, for example, in Japanese Unexamined Patent Application Publication No. 2013-143504 (hereinafter, JP '504), a method is known with which interstitial oxygen atoms are introduced into the surface layer of the wafer by a rapid thermal process in an oxygen-containing atmosphere.

In WO '326, by using a wafer having, among general wafers, a relatively high oxygen concentration in its surface layer, specifically, about $1\times10^{18}/cm^3$, it is possible to reduce the silicon missing phenomenon to a certain extent, but there is still room for improvement. According to the method of JP '504, while, by inward diffusion of oxygen from the wafer surface, an oxygen concentration peak forms at a predetermined depth from the surface, in the vicinity of the surface, a region having a relatively low oxygen concentration is formed by outward diffusion of oxygen during temperature ramp-down. Since semiconductor devices are generally formed in the surface layer of the wafer, there is still a problem in that, due to the silicon missing phenomenon affected by outward diffusion of oxygen, devices having a three-dimensional structure cannot be formed suitably.

It is an object of the present invention to provide a silicon wafer suitable for forming semiconductor devices having a minute three-dimensional structure, and a method for producing the silicon wafer.

SUMMARY OF THE INVENTION

In order to achieve the above object, the present invention provides a Czochralski silicon wafer, the Czochralski silicon wafer including: a bulk layer region having an oxygen concentration of $0.5\times10^{18}/cm^3$ or more; and a surface layer region extending from a surface of the wafer to 300 nm in depth, and having an oxygen concentration of $2\times10^{18}/cm^3$ or more.

By setting the oxygen concentration in the bulk layer within the above range, the interstitial oxygen prevents a slip dislocation during wafer production and device formation. Moreover, by setting the oxygen concentration in the surface layer within the above range, it is possible to effectively reduce the silicon missing phenomenon, and prevent, e.g., collapse of pillars, fins, etc.

In the silicon wafer, the surface layer from the surface to 300 nm in depth preferably has an oxygen concentration of $2.5\times10^{18}/cm^3$ or more.

By setting the oxygen concentration in the surface layer within the above range, it is possible to further increase the effect of reducing the silicon missing phenomenon.

For the silicon wafer, it is preferable that in a region of the wafer from the surface to 30 μm in depth, the density of void defects having a size of 15 nm or more is $1\times10^6/cm^3$ or less, and the density of oxygen precipitates having an equivalent spherical diameter of 15 nm or more is $1\times10^6/cm^3$ or less.

If the density of void defects having the above size or more is within the above range, the breakdown characteristics of gate oxide films on fins, pillars, etc. constituting three-dimensional structures are not reduced by the void defects. Moreover, by setting the density of oxygen precipitates having the above diameter or more within the above range, it is possible to prevent local deformation of the wafer due to the slip dislocation from the oxygen precipitates, and thus to prevent a reduction in the shape accuracy of the three-dimensional structures.

For the silicon wafer, in a region of the wafer from 100 μm in depth to a thickness center of the wafer, a vacancy concentration is preferably $1\times10^{12}/cm^3$ or more.

If the vacancy concentration is within the above range, oxygen precipitates are formed in the region of the above depth during device production. Since oxygen precipitates have a gettering effect of metallic impurities, the electric properties in the device forming region improve.

In the silicon wafer, a concentration difference $C_v-C_I$ between a vacancy concentration $C_v$ and an interstitial silicon atom concentration $C_I$ in the single-crystal silicon is preferably within a range of $-2.0\times10^{12}/cm^3$ or more and $6.0\times10^{12}/cm^3$ or less.

A negative value of the concentration difference $C_v-C_I$ means that the interstitial silicon atoms remain dominantly, and a positive value thereof means that the vacancies remain dominantly. By limiting the concentration difference $C_v-C_I$ within the above range, i.e., by using a silicon wafer including a region generally called a defect-free region, it is possible to prevent the grown-in defects introduced during growth of silicon single crystals from remaining in the region of the wafer right under the wafer surface where the interstitial oxygen concentration is supersaturated. It is possible to adjust the value of the concentration difference $C_v-C_I$ by controlling the ratio V/G, where V is the pull-up rate of the silicon single crystals, and G is the temperature gradient near the solid-liquid interface (within the temperature range from the melting point of silicon to about 1350° C.).

Also, the present invention provides a production method for producing a silicon wafer including a surface layer, and obtained by slicing an ingot of single-crystal silicon grown by a Czochralski method, the production method comprising: in an oxidizing atmosphere, keeping the silicon wafer for 5 seconds or more and 30 seconds or less at a maximum temperature within a range of 1315° C. or more and 1375° C. or less, and then cooling the silicon wafer from the maximum temperature to 1100° C. at a cooling rate of not less than 50° C./second and not more than 150° C./second; and after the cooling of the silicon wafer, removing the surface layer to a depth where an oxygen concentration is $2 \times 10^{18}/cm^3$ or more.

By keeping the wafer for a predetermined time within the above temperature range, it is possible to introduce supersaturated interstitial oxygen ($2 \times 10^{18}/cm^3$ or more) which can effectively prevent the silicon missing phenomenon in the three-dimensional structures of pillars, fins, etc. Also, by cooling the wafer at a cooling rate within the above cooling range, it is possible to minimize outward diffusion of the interstitial oxygen during cooling. Also, by removing a portion of the surface layer to the above depth, it is possible to expose a high-oxygen region in the device formation region of the surface, and thus to ensure that the silicon missing phenomenon is reduced.

For the production method, the maximum temperature is preferably within a range of 1325° C. or more and 1350° C. or less.

By keeping the wafer within the above temperature range, it is possible to reliably introduce supersaturated interstitial oxygen which can effectively prevent the silicon missing phenomenon while reducing the slip resulting from heat stress.

For the production method, the oxidizing atmosphere is preferably an oxygen atmosphere of which the oxygen partial pressure is within a range of 1% or more and 100% or less.

By setting the oxygen partial pressure within the above range, it is possible to effectively introduce interstitial oxygen into the silicon wafer.

The production method preferably further comprises subjecting the wafer to heat treatment within a range of 1 hour or more and 4 hours or less and within a range of 800° C. or more and 1000° C. or less such that in a region of the wafer from 100 µm in depth to a thickness center of the wafer, oxygen precipitates having an equivalent spherical diameter of 15 nm or more are formed at a density of $1 \times 10^8/cm^3$ or more.

By heat-treating the wafer within the range of the above temperature and the range of the above time, it is possible to reliably introduce, into the wafer, oxygen precipitates having the above diameter and formed at the above density, thereby ensuring a gettering effect of metallic impurities.

For the production method, vacancies are preferably introduced by the thermal process in an oxidizing atmosphere such that a vacancy concentration is $1 \times 10^{12}/cm^3$ or more in the region of the wafer from 100 µm in depth to the thickness center.

If the vacancy concentration is within the above range, as described above, oxygen precipitates are formed in the above depth region during device production, and the electric properties in the device formation region improve due to the gettering effect of metallic impurities by the oxygen precipitates.

The production method preferably further comprises introducing vacancies and interstitial silicon atoms such that a concentration difference $C_v-C_I$ between a vacancy concentration $C_v$ and an interstitial silicon atom concentration $C_I$ in the single-crystal silicon is within a range of $-2.0 \times 10^{12}/cm^3$ or more and $6.0 \times 10^{12}/cm^3$ or less.

By limiting, to $-2.0 \times 10^{12}/cm^3$ or more and $6.0 \times 10^{12}/cm^3$ or less, the range of the concentration difference $C_v-C_I$ between the vacancies and the interstitial silicon in the single-crystal silicon, as described above, it is possible to prevent the grown-in defects introduced during growth of silicon single crystals from remaining in the region of the wafer right under the wafer surface where the interstitial oxygen concentration is supersaturated.

Effects of the Invention

The present invention provides a silicon wafer suitable for forming semiconductor devices having a minute three-dimensional structure; and a method for producing the silicon wafer.

DETAILED DESCRIPTION OF THE INVENTION

Figure 1:
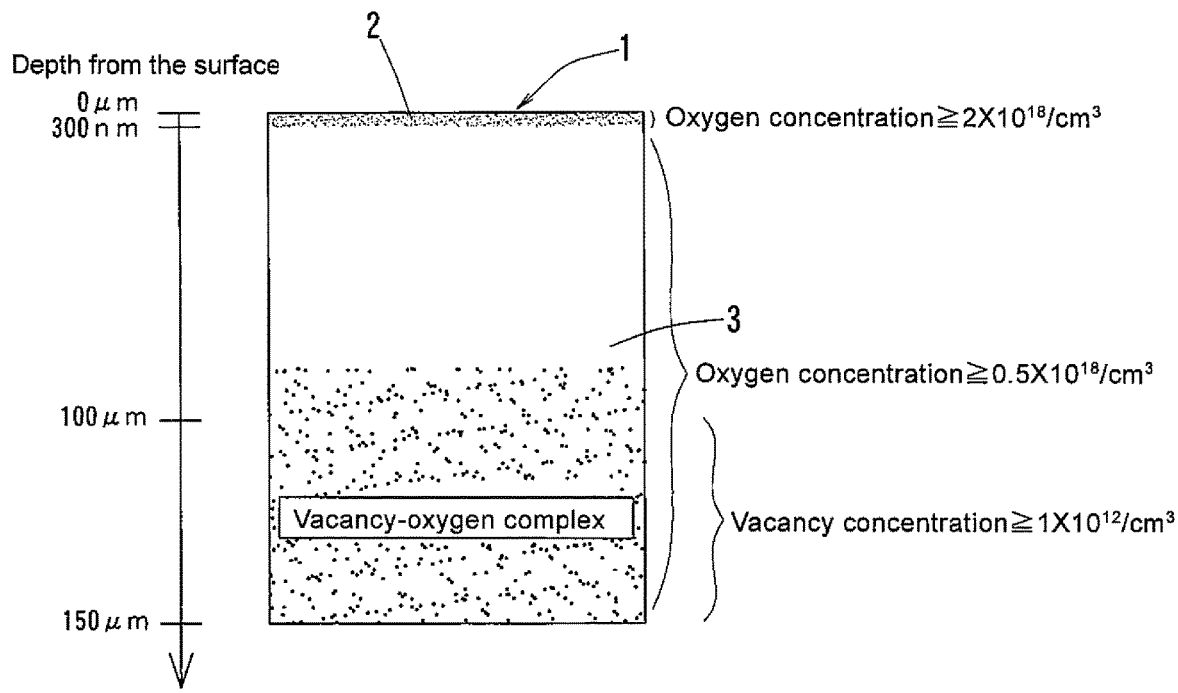
FIG. 1 is a view schematically illustrating a sectional structure of a silicon wafer according to the present invention.
Figure 2:
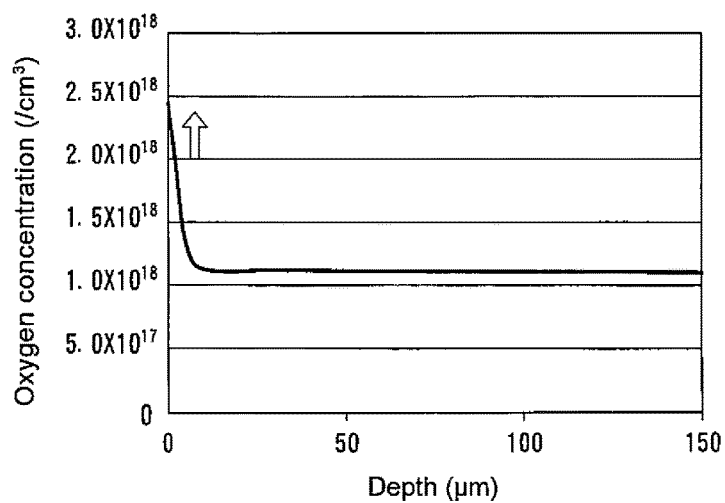
FIG. 2 is a view showing an oxygen concentration profile of the silicon wafer illustrated in FIG. 1.
Figure 3:
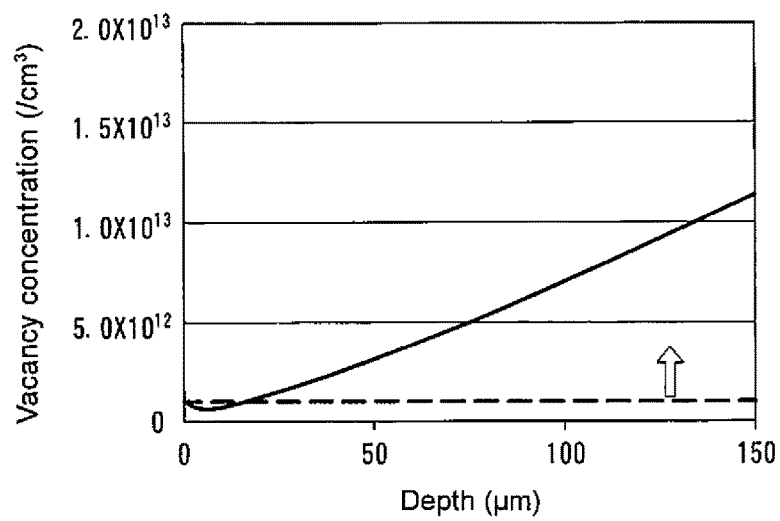
FIG. 3 is a graph showing a vacancy concentration profile of the silicon wafer illustrated in FIG. 1.

FIG. 1 illustrates a sectional structure of a silicon wafer (hereinafter referred to as the "wafer 1") according to the present invention. FIG. 2 and FIG. 3 illustrate, respectively, an oxygen concentration profile and a vacancy concentration profile of the wafer 1 illustrated in FIG. 1. The wafer 1 is a Czochralski wafer (i) obtained by slicing a single-crystal silicon ingot grown by the Czochralski method, and (ii) subjected to a predetermined heat treatment (described later). The wafer 1 is used mainly for semiconductor devices having a three-dimensional structure of pillars, fins, etc. The wafer 1 includes a surface layer region 2 constituting the region of the wafer from the surface to 300 nm in depth; and a bulk layer region 3 constituting a region of the wafer deeper than the surface layer 2. FIG. 1 illustrates only the region of the wafer from the surface to about 150 µm in depth.

This Czochralski wafer is obtained by slicing a silicon ingot grown by the Czochralski method, and is subjected to a predetermined heat treatment for surface modification. This silicon ingot contains, in the crystals, oxygen, as interstitial oxygen, eluted from a quartz crucible used during growth. While this interstitial oxygen is partially diffused outward from the wafer surface by the above heat treatment, a predetermined amount of interstitial oxygen remains in the surface layer region 2. That interstitial oxygen is present in the surface layer region 2 of the wafer 1 makes a difference from an epitaxial wafer, in which silicon is epitaxially grown on the surface of a Czochralski wafer by chemical vapor deposition (CVD), and interstitial oxygen is hardly present in the surface layer.

The surface layer (surface layer region) 2 is a device forming region, in which three-dimensional structures are formed. That is, devices are formed in the region of the wafer 1 from the surface to 300 nm in depth. The interstitial oxygen concentration in the surface layer 2 is $2 \times 10^{18}/cm^3$ or more, and preferably $2.5 \times 10^{18}/cm^3$ or more. As described later, this interstitial oxygen is introduced by a rapid thermal process in an oxygen atmosphere. The higher this oxygen concentration, the higher the effect of reducing the silicon missing phenomenon while forming the three-dimensional structures. By setting this concentration to $2 \times 10^{18}/cm^3$ or more, it is possible to obtain a predetermined reducing effect to such an extent that device formation is not adversely affected. This interstitial oxygen concentration can be increased up to $4 \times 10^{18}/cm^3$, which is the upper limit of the equilibrium concentration (solid solubility) of oxygen in the silicon.

The bulk layer (bulk layer region) 3 is located in a region of the wafer 1 deeper than the surface layer 2 in the thickness direction of the wafer 1, i.e., a region of the wafer 1 deeper than 300 nm in depth. The interstitial oxygen concentration in the bulk layer 3 is $0.5 \times 10^{18}/cm^3$ or more. The higher this oxygen concentration, the higher the effect of fixing the slip dislocation generated during heat treatment for wafer production or during heat treatment for device formation. By setting this concentration to $0.5 \times 10^{18}/cm^3$ or more, it is possible to obtain a predetermined fixing effect to such an extent that the wafer 1 is not locally deformed. On the other hand, the interstitial oxygen concentration in the bulk layer 3 is preferably $1.5 \times 10^{18}/cm^3$ or less. By limiting the interstitial oxygen concentration within the above range, it is possible to reduce abnormal appearance of oxygen precipitates near the interface between the surface layer 2 and the bulk layer 3, and to prevent problems relating to the device properties such as a latch-up phenomenon.

In an outer portion of the surface layer region of the wafer 1 extending from the surface to 30 μm in depth, the density of void defects is $1 \times 10^6/cm^3$ or less. The void defects are cavity defects caused by aggregation of vacancies introduced into the crystals during growth of a silicon ingot. If void defects are present in the device formation region, the breakdown characteristics of gate oxide films on the three-dimensional structures may deteriorate. In the step of keeping the wafer at a high temperature during the rapid thermal process in the wafer production, the void defects shrink to such an extent that the breakdown characteristics are not affected, or disappear, but the void defects may partially remain in the crystals. By setting the density of the void defects after the rapid thermal process within the above range, it is possible to minimize the influence of the void defects on the breakdown characteristics. The sizes of void defects controlled to the above density can be appropriately set, for example, to not less than 5 nm or not less than 10 nm, but they are particularly preferably set to 15 nm or more.

In the region of the wafer 1 from the surface to 30 μm in depth, the density of oxygen precipitates is $1 \times 10^6/cm^3$ or less. While oxygen precipitates present in a deep region of the bulk layer 3 (e.g., at the depth of several tens of micrometers or more) will effectively act as gettering sources of metallic impurities, oxygen precipitates present near the surface layer 2 could become slip dislocation starting points, thereby adversely affecting the shape accuracy of the three-dimensional structures. By setting the density of the oxygen precipitates after the rapid thermal process, it is possible to minimize the influence of the oxygen precipitates on the shape accuracy. For the sizes of the oxygen precipitates controlled to the above density, the equivalent spherical diameters of the oxygen precipitates can be appropriately set, for example, to not less than 5 nm or not less than 10 nm, but they are particularly preferably set to 15 nm or more.

Such oxygen precipitates not only have a spherical shape but also often have a plate shape. For example, if the oxygen precipitates have a square plate shape having an aspect ratio (thickness/diagonal length) of β=0.01, since, for example, the equivalent spherical diameter of 15 nm corresponds to a diagonal length of about 56 nm, the density of the plate-shaped oxygen precipitates having a diagonal length of about 56 nm or more is set to $1 \times 10^6/cm^3$ or less.

In an overlap region of the bulk layer 3 from 100 μm in depth to the thickness center of the wafer 1, the vacancy concentration is $1 \times 10^{12}/cm^3$ or more. It is considered that vacancies are present as complexes with interstitial oxygen (vacancy-oxygen complexes $VO_x$). The vacancies (vacancy-oxygen complexes) promote formation of oxygen precipitates in the bulk layer 3 during device formation, and a high gettering effect of metallic impurities is ensured. By setting this vacancy concentration to $5 \times 10^{12}/cm^3$ or more, it is possible to ensure a higher gettering effect.

The silicon ingot from which the wafer 1 is formed is not particularly limited, but, in this embodiment, a silicon ingot is used in which the concentration difference $C_v$-$C_I$ between the vacancy concentration $C_v$ and the interstitial silicon atom concentration $C_I$ is within the range of $-2.0 \times 10^{12}/cm^3$ or more and $6.0 \times 10^{12}/cm^3$ or less (neutral region). By setting the concentration difference $C_v$-$C_I$ within the above range, it is possible to easily produce a high-quality wafer 1 in which void defects are not introduced during growth of the crystals, or, even if void defects are introduced, their sizes are very small and no void defects are present in the device formation region due to the rapid thermal process.

Even though the concentration difference $C_v$-$C_I$ is within the range of $1.3 \times 10^{13}/cm^3$ or more and $5.6 \times 10^{12}/cm^3$ or less (V-rich crystals) or within the range of $3.5 \times 10^{12}/cm^3$ or more and $1.1 \times 10^{13}/cm^3$ or less (Low COP crystals), it is still possible to make void defects disappear by appropriately changing the maximum temperature and the retention time of the rapid thermal process.

Next, a method for producing the wafer 1 of FIG. 1 is described. As the wafer 1, a mirror surface wafer obtained by slicing a single-crystal silicon ingot grown by the Czochralski method is used. First, this mirror surface wafer was subjected to a rapid thermal process in an oxygen atmosphere where the oxygen partial pressure is 100%. The temperature ramp-up rate of this rapid thermal process was set within the range of not less than 25° C./second and not more than 75° C./second, and the temperature ramp-up rate was reduced in a stepwise manner as the temperature approached the maximum temperature. Also, the maximum temperature was set to 1350° C., the retention time at the maximum temperature to 15 seconds, and the cooling rate to 120° C./second.

Figure 4:
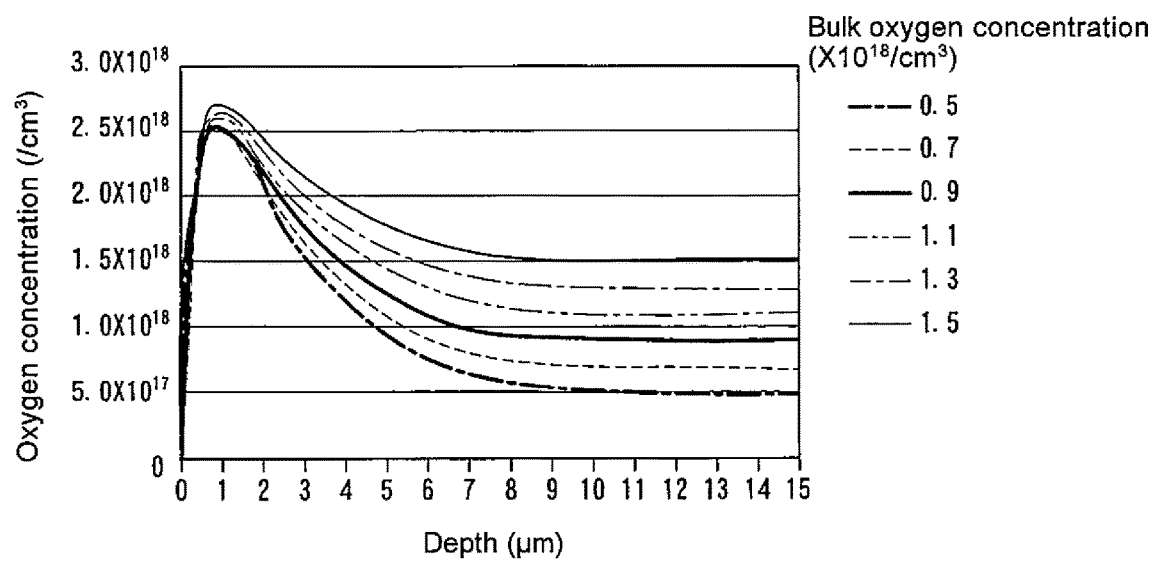
FIG. 4 is a graph showing an oxygen concentration profile (simulation result) after a rapid thermal process.

While the wafer is kept at the maximum temperature during this rapid thermal process, oxide films are formed on the surface of the wafer 1, and supersaturated interstitial oxygen is introduced from the interface between each oxide film and the silicon. The interstitial oxygen diffuses inwardly toward the thickness center of the wafer 1. On the other hand, during cooling of the wafer 1, the interstitial oxygen diffuses outwardly toward the surface of the wafer 1, and the oxygen concentration near the surface decreases. As a result, as shown in FIG. 4, the oxygen concentration profile after the rapid thermal process shows a distribution of oxygen concentration which is the highest at a certain depth (about 1 µm in this example) from the surface of the wafer 1, and which decreases toward the surface of the wafer 1 and toward the thickness center of the wafer 1.

Figure 5:
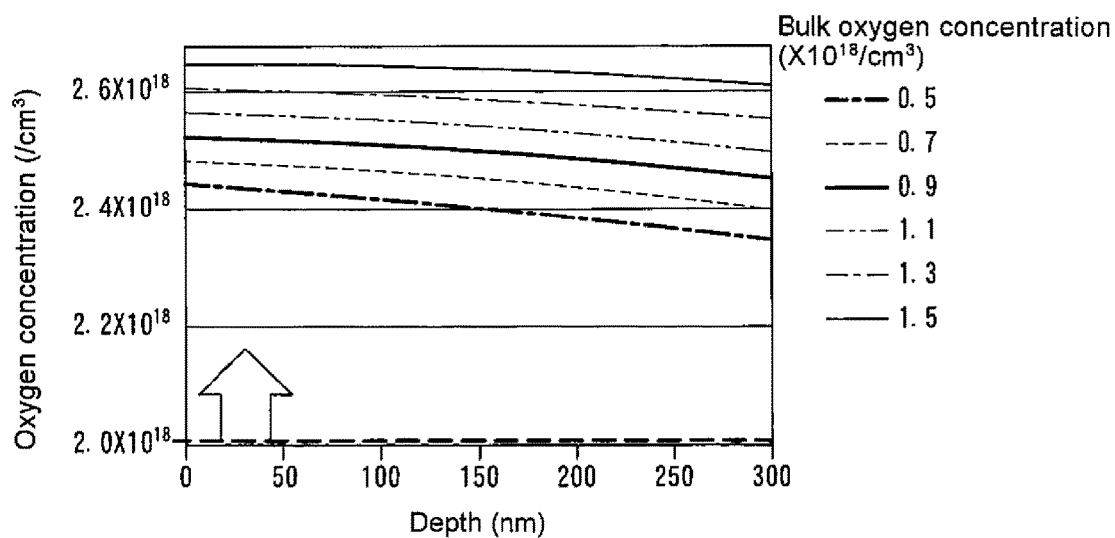
FIG. 5 is a graph showing an oxygen concentration profile (simulation result) after polishing the surface layer of the wafer.

Next, the surface of the wafer 1 was removed by polishing to the depth where the oxygen concentration is $2 \times 10^{18}/cm^3$ or more. As a result, as shown in FIG. 5, a region where the oxygen concentration is high due to the oxygen introduced by the rapid thermal process is formed from the surface to 300 nm in depth. The higher this oxygen concentration, the higher the effect of reducing the silicon missing phenomenon during formation of the three-dimensional structures. Especially by setting this oxygen concentration to $2.5 \times 10^{18}/cm^3$ or more, it is possible to obtain a high reducing effect. This oxygen concentration tends to increase with an increase in the maximum temperature of the rapid thermal process, an increase in the retention time at the maximum temperature, or an increase in the cooling rate.

Figure 6:
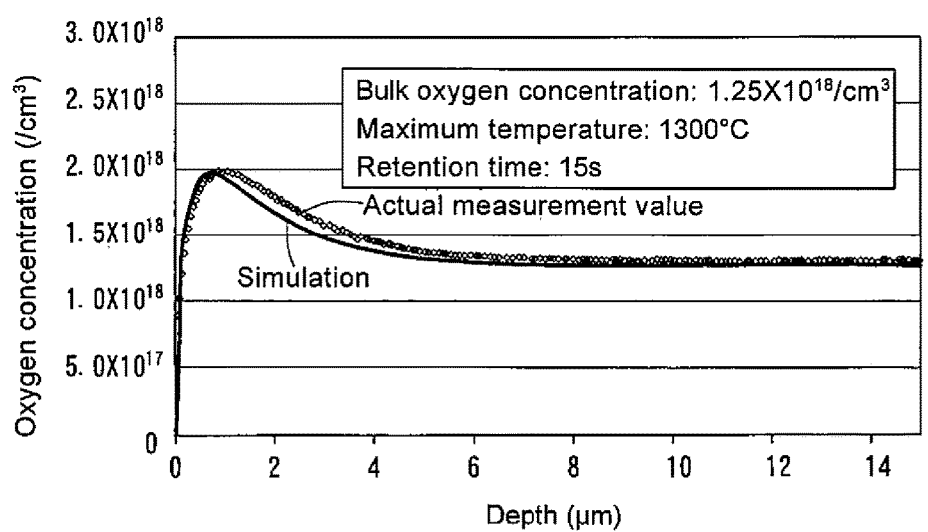
FIG. 6 is a graph showing the comparison of a simulation result of an oxygen concentration profile and an actual measurement result thereof.

In the above, for example, the distribution of the oxygen concentration during the thermal process was obtained by simulation (see FIGS. 2 to 5), and the accuracy of the oxygen concentration simulation was verified. As shown in FIG. 6, from the comparison of this simulation result with the actual measurement result of the oxygen concentration obtained by SIMS (Secondary Ion Mass Spectroscopy), it was confirmed that the simulation result and the actual measurement result substantially coincide with each other, and thus the actual measurement result can be accurately predicted by simulation.

Figure 7:
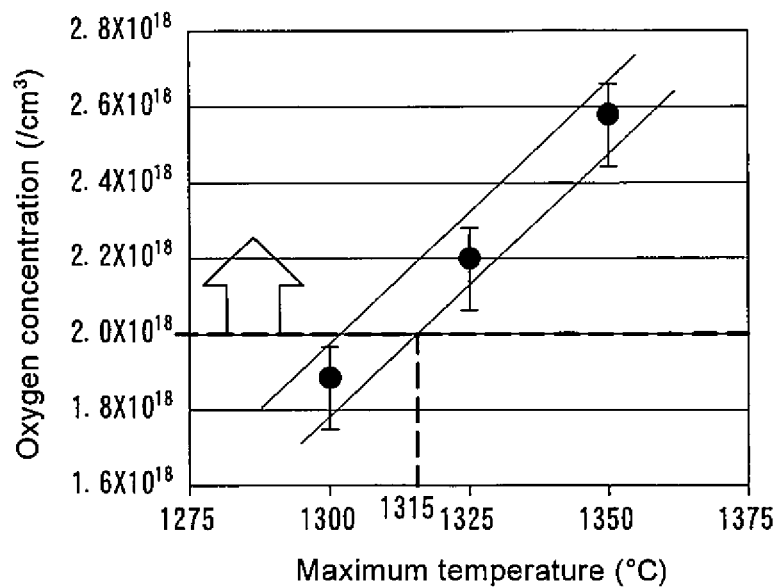
FIG. 7 is a graph showing the relationship between the maximum temperature of a rapid thermal process and an oxygen concentration.
Figure 8:
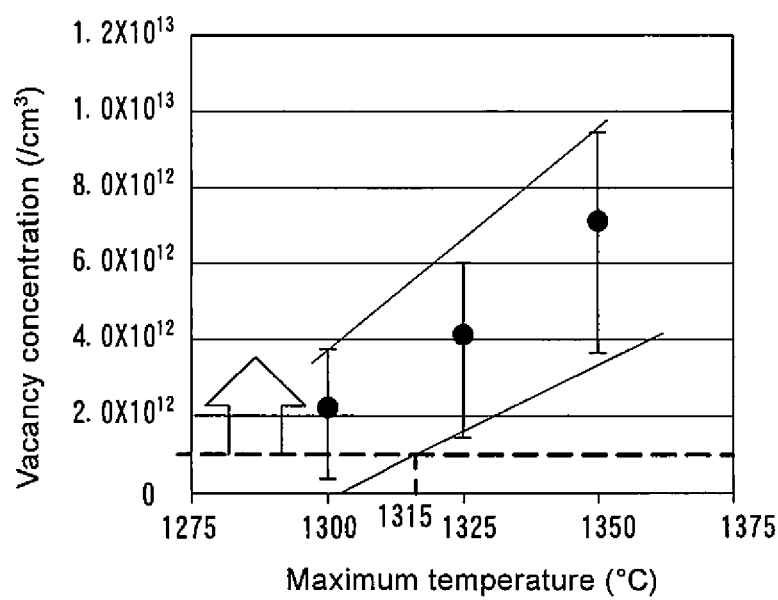
FIG. 8 is a graph showing the relationship between the maximum temperature of a rapid thermal process and a vacancy concentration.

FIGS. 7 and 8 each shows the relationship between the peak value of the oxygen concentration or the vacancy concentration after the rapid thermal process, and the maximum temperature of the rapid thermal process. In FIGS. 7 and 8, the black circles of the respective data values correspond to the oxygen concentration of $1.1 \times 10^{18}/cm^3$ in the bulk layer, the lower ends of the error bars correspond to the oxygen concentration of $0.5 \times 10^{18}/cm^3$ in the bulk layer, and the upper ends of the error bars correspond to the oxygen concentration of $1.5 \times 10^{18}/cm^3$ in the bulk layer. By setting this maximum temperature within the range of 1315° C. or more and 1375° C. or less, regardless of the oxygen concentration in the bulk layer 3, it is possible to achieve an oxygen concentration and a vacancy concentration that are effective in reducing the silicon missing phenomenon, i.e., $2 \times 10^{15}/cm^3$ or more, and $1.1 \times 10^{12}/cm^3$ or more, respectively. If this maximum temperature is less than 1315° C., it is impossible to ensure a sufficient oxygen concentration and a sufficient vacancy concentration, and if more than 1375° C., the problem of a slip could become prominent. Also, by setting this maximum temperature to 1325° C. or more and 1350° C. or less, it is possible to reliably keep the oxygen concentration and the vacancy concentration within the above respective concentration ranges, and to reliably reduce a slip.

If an oxygen atmosphere is selected as the oxidizing atmosphere for the rapid thermal process, the oxygen partial pressure is preferably 100% in that interstitial oxygen can be efficiently introduced into the wafer 1, but can be set appropriately within the range of 1% or more and 100% or less. The oxidizing atmosphere is not limited to an oxygen atmosphere, and may be another atmosphere provided that interstitial oxygen can be introduced into the wafer 1.

After the rapid thermal process and then removing the surface, the wafer 1 was subjected to heat treatment at 800° C. for 1 hour in an argon atmosphere. By this heat treatment, oxygen precipitates having an equivalent spherical diameter of 15 nm or more are introduced, at a density of $1 \times 10^8/cm^3$ or more, into the region of the wafer 1 from 100 µm in depth to the thickness center. By ensuring that such oxygen precipitates are introduced into the wafer in this way, it is possible to ensure the gettering effect of metallic impurities. It is known that formation of oxygen precipitates is promoted by the vacancies (vacancy-oxygen complexes) introduced into the wafer 1 by the rapid thermal process, and the region where oxygen precipitates form corresponds to the region where the vacancy concentration (vacancy-oxygen complex concentration) is $1 \times 10^{12}/cm^3$ or more.

The above heat treatment is preferably performed within the temperature range of not less than 800° C. and not more than 1000° C., and the time range of not less than 1 hour and not more than 4 hours, which hardly affect the vacancies (vacancy-oxygen complexes) introduced by the rapid thermal process.

The silicon ingot as the starting material in this method for producing the wafer 1 is not particularly limited, but, in this embodiment, a single-crystal silicon ingot is used which is grown by the Czochralski method, and in which the concentration difference $C_v$–$C_I$ between the vacancy concentration $C_v$ and the interstitial silicon atom concentration $C_I$ is within the range of $-2.0 \times 10^{12}/cm^3$ or more and $6.0 \times 10^{12}/cm^3$ or less (neutral region). By limiting the concentration difference $C_v$–$C_I$ within the above range, it is possible to easily produce a high-quality wafer 1 in which no void defects are present in the device formation region due to a rapid thermal process.

The above-described wafer 1 and method for producing the wafer are mere examples, and a modification may be made thereto provided that the object of the present invention can be achieved, i.e., it is possible to provide a silicon wafer 1 suitable for formation of semiconductor devices having a minute three-dimensional structure, and a method for producing the silicon wafer 1.

DESCRIPTION OF REFERENCE NUMERALS

1: Silicon wafer (wafer)
2: Surface layer
3: Bulk layer

The invention claimed is:

1. A Czochralski silicon wafer comprising a sliced ingot of single crystal silicon, the Czochralski silicon wafer including: a surface layer region being a region extending from a surface of the Czochralski silicon wafer to a depth of 300 nm, and a bulk layer region being a remainder of the Czochralski silicon wafer,
   wherein an oxygen concentration in the surface layer region is greater than an oxygen concentration in the bulk layer region;
   wherein the bulk layer region has an oxygen concentration of at least $0.5 \times 10^{18}/cm^3$ and no more than $1.5 \times 10^{18}/cm^3$; and
   wherein the surface layer region has an oxygen concentration of at least 2.5 $2 \times 10^{18}/cm^3$.

2. The Czochralski silicon wafer according to claim 1, wherein, in an outer portion of the surface layer region of the wafer extending from the surface to 30 µm in depth, a density of void defects having a size of at least 15 nm is no more than $1 \times 10^6/cm^3$, and a density of oxygen precipitates having an equivalent spherical diameter of at least 15 nm is no more than $1 \times 10^6/cm^3$.

3. The Czochralski silicon wafer according to claim 1, wherein, in a portion of the bulk layer region extending from 100 μm in depth to a thickness center of the wafer, a vacancy concentration is at least $1 \times 10^{12}/cm^3$.

4. The Czochralski silicon wafer according to claim 1, wherein a concentration difference between a vacancy concentration and an interstitial silicon atom concentration in the single-crystal silicon is within a range of at least $-2.0 \times 10^{12}/cm^3$ to no more than $6.0 \times 10^{12}/cm^3$.

\* \* \* \* \*